(12) United States Patent
Shinma et al.

(10) Patent No.: US 6,471,501 B1
(45) Date of Patent: Oct. 29, 2002

(54) MOLD FOR FABRICATING SEMICONDUCTOR DEVICES

(75) Inventors: Yasuhiro Shinma, Kawasaki (JP); Muneharu Morioka, Kawasaki (JP); Norio Fukasawa, Kawasaki (JP); Yuzo Hamanaka, Kawasaki (JP); Tadashi Uno, Kawasaki (JP); Hirohisa Matsuki, Kawasaki (JP); Kenichi Nagashige, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/272,754

(22) Filed: Mar. 18, 1999

(30) Foreign Application Priority Data

Mar. 20, 1998 (JP) .......................................... 10-072879

(51) Int. Cl.$^7$ .............................................. B29C 45/14
(52) U.S. Cl. .................... 425/127; 425/192 R; 425/195; 425/406
(58) Field of Search ................................ 425/127, 128, 425/193, 406, 195, 192 R; 100/258 A; 438/108, 107, 127

(56) References Cited

U.S. PATENT DOCUMENTS

| | | | | |
|---|---|---|---|---|
| 3,864,819 A | * | 2/1975 | Ying .......................... 438/113 |
| 4,240,778 A | * | 12/1980 | Korytko ..................... 425/149 |
| 4,321,819 A | * | 3/1982 | Kraft et al. ............. 100/258 A |
| 4,531,901 A | * | 7/1985 | Andersen .................... 425/150 |
| 4,822,266 A | * | 4/1989 | Amano et al. ............... 425/151 |
| 4,907,959 A | * | 3/1990 | Hauch ........................ 425/406 |
| 4,954,067 A | * | 9/1990 | Brussel ....................... 425/406 |
| 5,217,733 A | * | 6/1993 | Dennehl et al. ............ 425/589 |
| 5,273,418 A | * | 12/1993 | Kato et al. .............. 425/192 R |
| 5,478,231 A | * | 12/1995 | Hehl .......................... 425/589 |
| 5,824,252 A | * | 10/1998 | Miyajima .................... 425/544 |
| 5,989,471 A | * | 11/1999 | Lian et al. .................. 425/406 |
| 6,261,501 B1 | * | 7/2001 | Miyagawa et al. .... 264/272.15 |

* cited by examiner

Primary Examiner—Jan H. Silbaugh
Assistant Examiner—Thu Khanh T. Nguyen
(74) Attorney, Agent, or Firm—Armstrong, Westerman & Hattori, LLP

(57) ABSTRACT

A mold for press-molding a resin package body includes a lower mold and an upper mold, wherein the upper mold includes a press plate held in a tiltable manner with respect to a press head used for urging the upper mold against the lower mold and a lock mechanism for locking the press plate. The lower mold includes an inner die carrying a semiconductor device and a resin tablet and an outer die surrounding the inner die in a manner movable up and down with respect to the inner die. In operation, the press plate is first engaged with the outer die in the unlocked state to achieve an exact parallelism with respect to the inner die, and after locking the press plate and melting the resin tablet, the press plate is urged further toward the inner die while simultaneously lowering the outer die such that the space formed by the lower die, outer die and the press plate for accommodating a semiconductor chip is collapsed.

14 Claims, 13 Drawing Sheets

MOLD FOR FABRICATING SEMICONDUCTOR DEVICES

BACKGROUND OF THE INVENTION

The present invention generally relates to fabrication of semiconductor devices and more particularly to a mold used for molding a resin semiconductor package body. More specifically, the present invention relates to a mold for molding a resin package body of a semiconductor device by a press-molding process.

With ever-continuing trend of miniaturization of electronic apparatuses and devices, intensive efforts are being made on miniaturization of semiconductor devices and integrated circuits. As an ultimate package form of such miniaturized semiconductor devices and integrated circuits, there is a concept of so-called chip-size package in which the size of the semiconductor package is reduced to the size of a semiconductor chip.

In another aspect, such a miniaturization of semiconductor integrated circuits has brought the tendency of ever-increasing integration density, while such an increase of the integration density has raised the problem of excessively narrowed pitch for interconnection pins used in semiconductor integrated circuits for external connection. In order to overcome the foregoing problem of narrow pitch of interconnection pins, there is a proposal of so-called ball grid array, in which bump electrodes are arranged two-dimensionally on a major surface, such as a bottom surface, of a semiconductor chip. By using a ball grid array, it is possible to increase the number of interconnection pins substantially, while simultaneously reducing the overall size of the semiconductor device.

As such a bump electrode, provided on a pad electrode of a semiconductor chip, is mechanically fragile, there is a proposal to cover the bottom surface of the semiconductor chip, on which the bump electrodes are provided, by a thin layer of potting resin. By providing such a thin layer of potting resin, not only the bump electrodes are protected but also the bottom surface of the semiconductor chip, on which a number of semiconductor devices are formed. In order to use the foregoing promising construction, it is necessary to establish the technology to cover the bottom surface of the semiconductor chip by a thin layer of potting resin.

A resin film can be formed on a semiconductor chip by various processes including a transfer molding process, an injection-molding process, a press-molding process, and the like, wherein the press-molding process is a promising process for forming such a thin resin film on a semiconductor device in view of the low cost of the process and the inexpensive facility for conducting the process.

In a press-molding process, a mold formed of a lower mold and an upper mold are used, wherein the lower and upper molds are held on a press in a state that a semiconductor device or wafer is held between the lower mold and the upper mold together with a resin tablet of a thermosetting resin. In operation, the press is activated in the state that the lower and upper molds are heated, wherein the resin tablet undergoes a melting and a thin resin film is formed so as to cover the semiconductor device. By curing the resin film thus formed, it is possible to form the desired resin protective film covering the surface of the semiconductor device.

These days, the bump electrodes formed on a semiconductor device generally have a reduced size of 25–50 $\mu$m as a result of device miniaturization. In the case of such highly miniaturized semiconductor devices, it is necessary to form the resin film on the surface of the semiconductor chip, on which the bump electrodes are formed, such that the resin film has a thickness of about 100 $\mu$m or less. Formation of such a thin resin film by a press molding process requires an exact parallelism between the upper mold and the lower mold at the time of the molding process.

With development in the art of mold manufacturing, the upper mold and the lower mold can be manufactured with exact size and shape. On the other hand, conventional press molding process has used the lower mold and the upper mold in the state that they are rigidly fixed on an upper platen and a lower platen each forming a press head. In such a construction, it will be noted that the lower mold and the upper mold no longer have a degree of freedom to move with respect to the lower and upper platens. Thereby, the parallelism between the lower mold and the upper mold is easily lost when there is a minute deviation from exact parallelism in the geometrical relationship between the upper and lower platens, and it has been difficult to form the desired thin resin film on the surface of the semiconductor chip by a press-molding process.

SUMMARY OF THE INVENTION

Accordingly, it is a general object of the present invention to provide a novel and useful mold used for fabricating semiconductor devices and a fabricating process of a semiconductor device using a press-molding process wherein the foregoing problems are eliminated.

Another and more specific object of the present invention is to provide a mold used for fabricating semiconductor devices wherein an exact parallelism is maintained between an upper mold and a lower mold irrespective of the precision of a press head used for pressing the mold.

Another object of the present invention is to provide a mold, comprising:
an upper mold; and
a lower mold disposed so as to face said upper mold,
said upper mold comprising:
   a press plate; and
   a fixing mechanism adapted to be mounted on a press head,
   said fixing mechanism carrying said press plate movably such that said press plate is tiltable with respect to a nominal plane perpendicular to a direction connecting said upper mold and said lower mold.

Another object of the present invention is to provide a mold, comprising:
an upper mold; and
a lower mold disposed so as to face said upper mold,
said lower mold comprising:
   a base block adapted to be mounted on a press head;
   a center block provided on said base block;
   an inner die provided on said center block so as to face said upper mold;
   a guide ring provided so as to surround said center block laterally, said guide ring being movable relatively to said center block in a direction of a force exerted by said press when conducting a press-molding process;
   an outer die provided on said guide ring so as to face said press plate; and
   a rolling body disposed in a gap between an outer periphery of said center block and an inner periphery of said guide ring.

Another object of the present invention is to provide a method of fabricating a semiconductor device by a press-molding process of a resin package body, comprising the steps of:

mounting a semiconductor wafer and a resin tablet on an inner die of a lower mold, said inner die being surrounded by an outer die forming a part of said lower mold together with said inner die, said outer die being movable with respect to said inner die in a direction perpendicular to a plane of said inner die;

lowering a press plate forming an upper mold in a state that said press plate is held in a tiltable manner with respect to a press head, by activating said press head, such that said press plate engages said outer die in a state that said outer die forms, together with said inner die, a space for accommodating said semiconductor chip and said resin tablet;

locking said press plate with respect to said press head in a state in which said press plate is engaged with said outer die;

causing said resin tablet to melt;

lowering a press plate further and simultaneously lowering said outer die with respect to said inner die, such that a volume of said space is reduced.

According to the present invention, the upper mold and the lower mold are held in exact parallelism even when there is a deviation from parallelism in the press head used for pressing the upper and lower molds with each other. Thereby, a thin resin film is formed on the surface of a semiconductor chip with a uniform thickness.

Other objects and further features of the present invention will become apparent from the following detailed description when read in conjunction with the attache drawings.

DETAILED DESCRIPTION OF THE PREFERRED EMBODIMENTS

Figure 1:
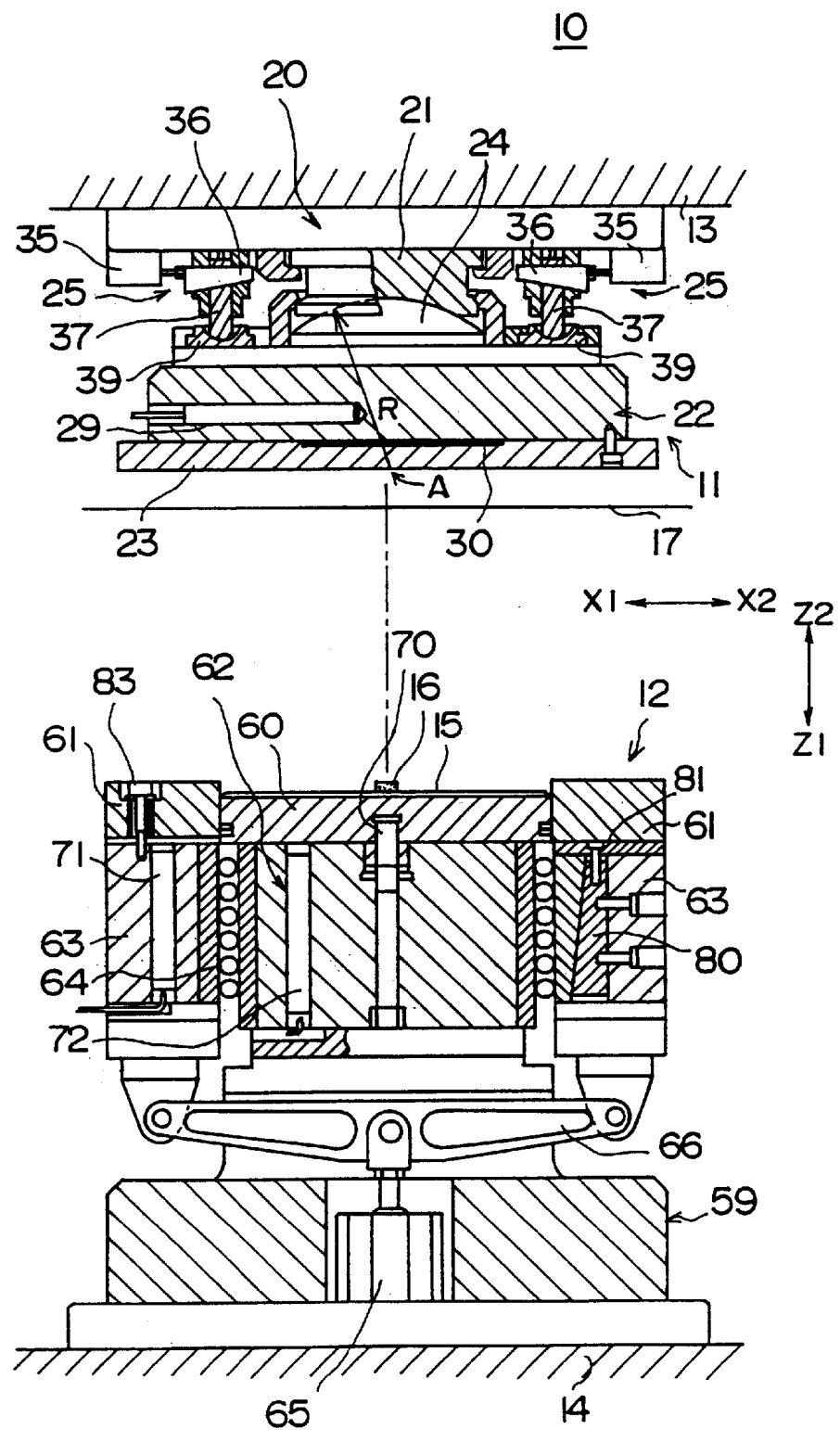
FIG. 1 is a diagram showing the construction of a mold according to an embodiment of the present invention.

FIG. 1 shows the construction of a mold 10 according to an embodiment of the present invention in a cross-sectional view.

Referring to FIG. 1, the mold 10 generally includes an upper mold 11 and a lower mold 12, wherein the upper mold 11 and the lower mold 12 are mounted on a press head together with a semiconductor device or wafer 15 and a resin tablet 16. By activating the press head, the upper mold 11 and the lower mold 12 are pressed to each other together with the resin tablet 16 and the semiconductor device 15, and a thin resin film is formed on the semiconductor device 15 as a result of such a press-molding process.

Figures 2A, 2B:
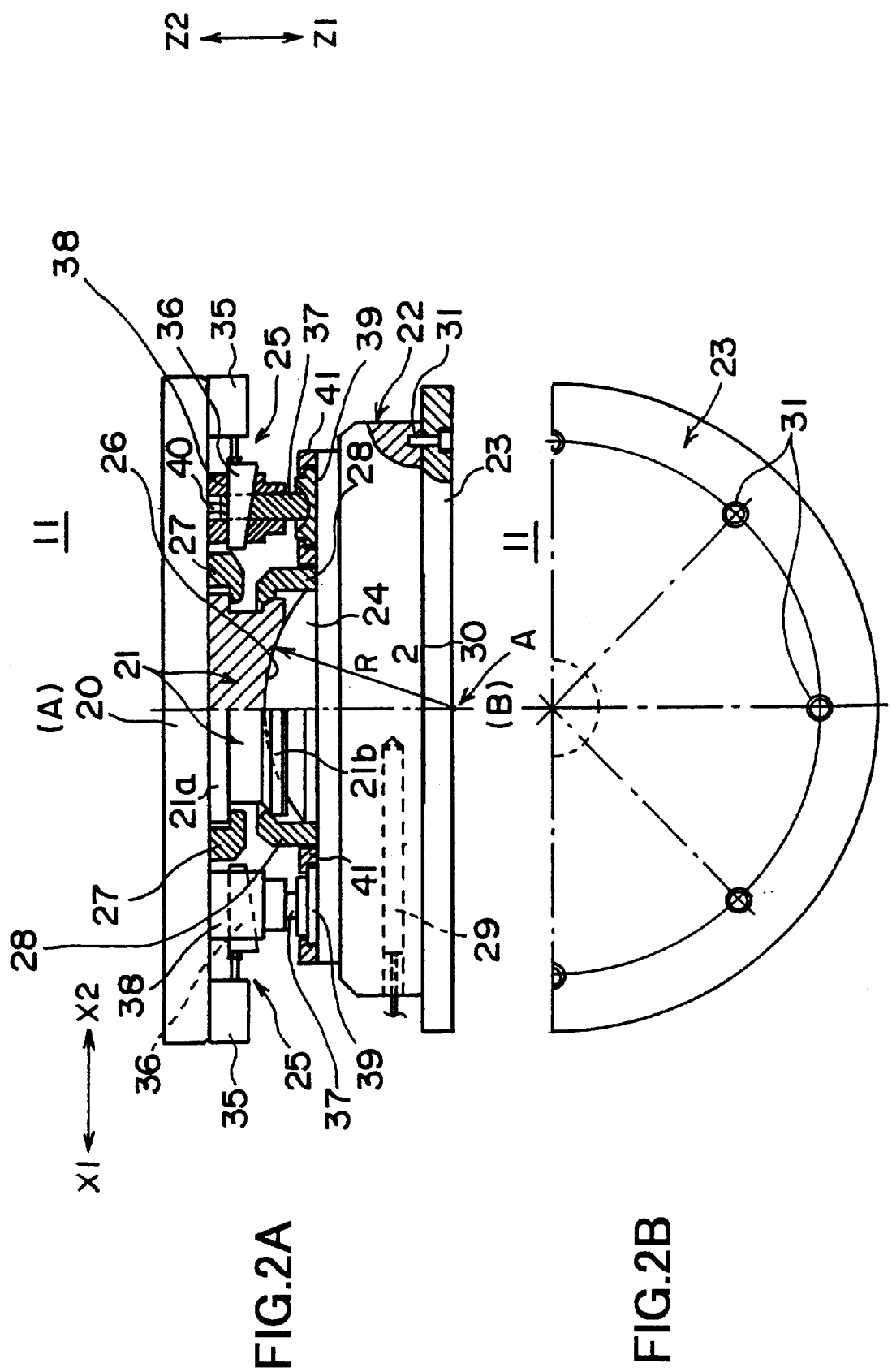
FIGS. 2A and 2B are diagrams showing an upper mold forming a part of the mold of FIG. 1 in an enlarged scale.
Figure 3:
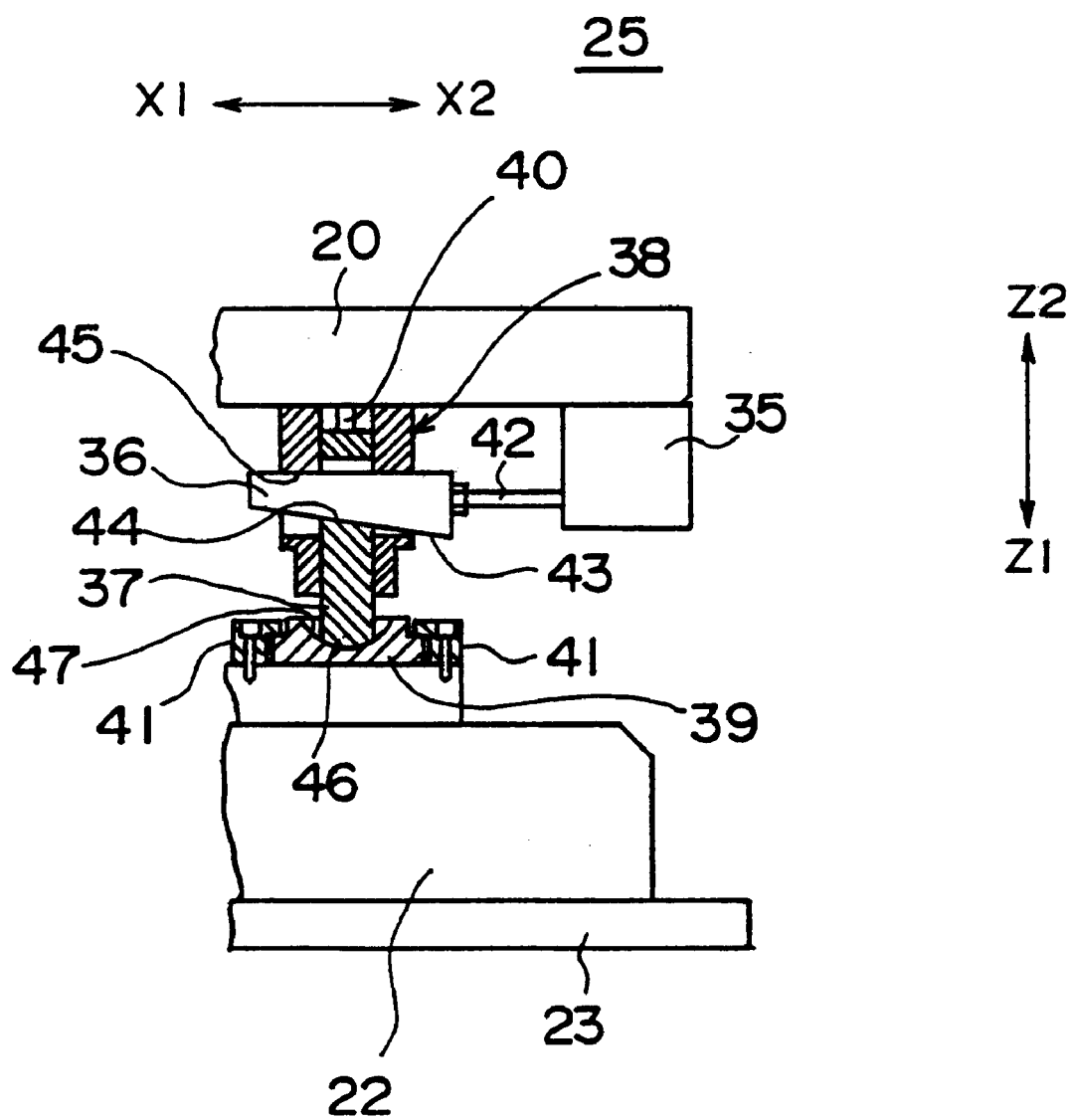
FIG. 3 is a diagram showing the construction of a balance lock mechanism used in the mold of FIG. 1.
Figure 4:
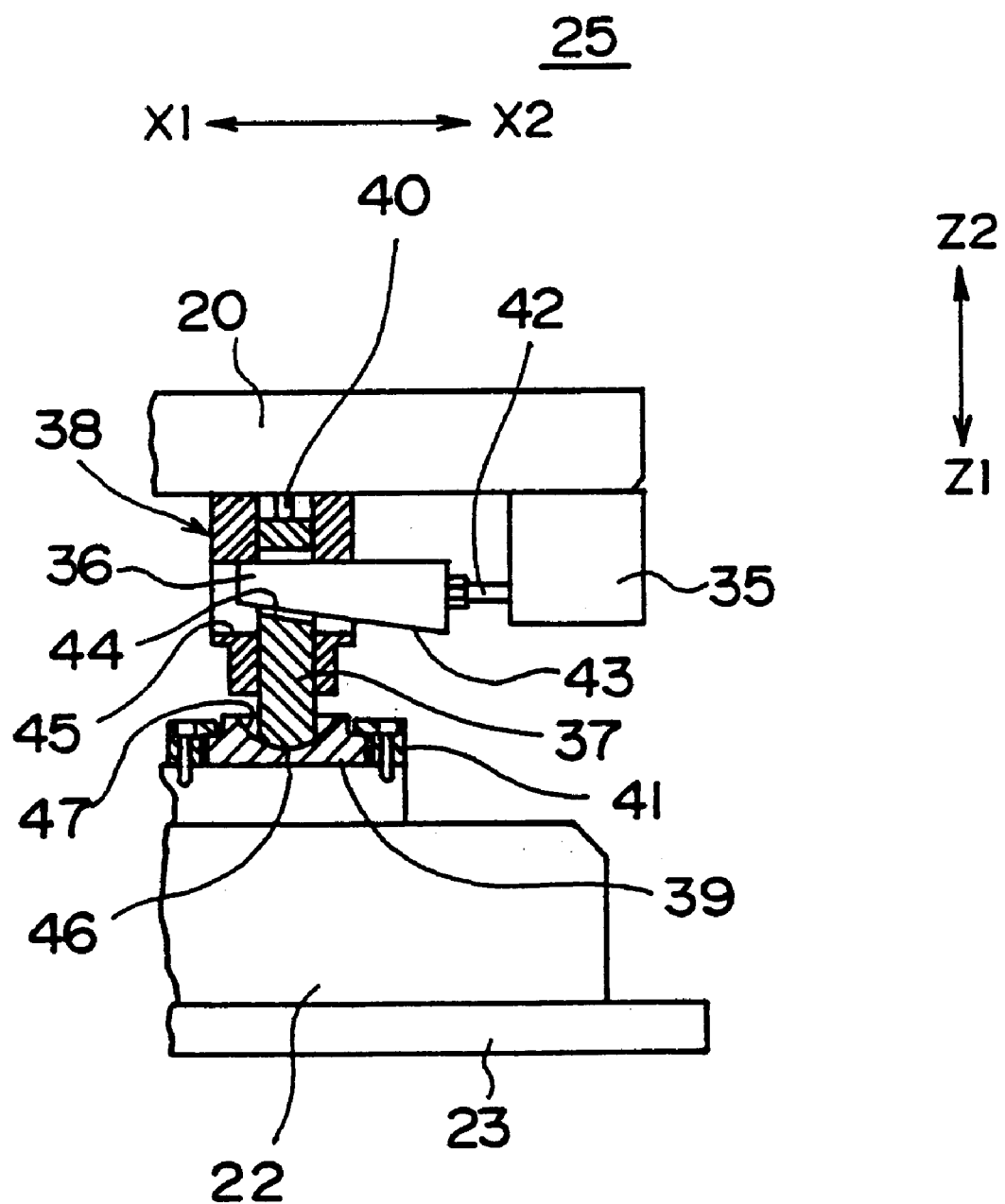
FIG. 4 is another diagram showing the balance lock mechanism of FIG. 3.

First, the construction of the upper mold 11 will be described with reference to FIGS. 1–4, wherein FIGS. 2A and 2B show the upper mold 11 respectively in a cross-sectional view and a plan view. On the other hand, FIGS. 3 and 4 show a balance lock mechanism provided on the upper mold 11.

Referring to the drawings, the upper mold 11 generally includes an upper fix plate 20, a balance 21, a heat plate 22, a press plate 23, a spherical block 24, a balance lock mechanism 25, and the like, wherein the upper fix plate 20 is a plate member fixed on an upper platen 13. The upper platen 13 constitutes a part of the press head and is moved in the $Z_1$ and $Z_2$ directions when the press is activated.

On the bottom surface of the upper fix plate 20, there is provided a first catch arm 27 having a generally L-shaped form, wherein the first catch arm 27 holds a balancer 21 by catching a stepped upper rim 21a of the balancer 21. Further, the balancer 21 includes a stepped bottom rim 21b and a spherically concaved bottom bearing surface 26.

As noted already, the first catch arm 27 holds the balancer 21 by engaging the upper stepped rim 21a, and thus, the balancer 21 is held on the upper platen 13 of the press via the upper fix plate 20. It should be noted that there exists a small play between the first catch arm 27 and the upper stepped rim 21a, and the balancer 21 is movable slightly in the horizontal direction represented in FIG. 1 by arrows $X_1$ and $X_2$.

Further, the upper mold includes a heat plate 22 including therein a cartridge heater 29, wherein the cartridge heater 29 is used to heat the resin 16 when conducting the press-molding process. It should be noted that the heat plate 22 carries a spherical bearing projection 24 on a top part thereof, and the heat plate 22 is mounted on the balancer 21 such that the spherical bearing projection 24 of the heat plate 22 engages the corresponding spherical bearing depression 26 of the balancer 21, by engaging a second L-shaped catch arm 28 with the stepped bottom rim 21b of the balancer 21.

Further below the heat plate 22, there is provided a press plate 23, wherein the press plate 23 is fixed upon the heat plate 22 directly by screwing a plurality of bolts 31. The press plate 23 is thereby used to press the molten resin at the time of the press-molding process. It should be noted that the press plate 23 is removable from the heat plate 22 by unscrewing the bolts 31. As the press plate 23 is thus removable from the heat plate 22, the press plate 23 can be easily replaced by a new one, whenever there occurs a damage in the press plate 23, without replacing the complex heat plate 22, which typically includes the L-shaped catch arm 28, the spherical bearing projection 24 and the cartridge heater 29 as noted before.

In the illustrated example, there is provided one or more spacers 30 between the heat plate 22 and the press plate 23, wherein the spacer 30 is typically a liner in the form of a sheet and disposed in correspondence to a central part of the press plate 23. By providing such a spacer 30, a bulge is formed in the press plate 23 in correspondence to the central part thereof, wherein the bulge can be adjusted in accordance with the variation in the height of the bump electrodes formed on the semiconductor device 15.

In more detail, it is known that the bump electrodes on the peripheral part of the semiconductor device 15 generally have a height larger than the height of the bump electrodes formed in the central part of the semiconductor device 15. The reason of this phenomenon is attributed to the electroplating process employed for forming the bump electrodes.

In the electroplating process for forming the bump electrodes, an electrical connection is made to an electrode pad formed at the outer periphery of the semiconductor device 15 for supplying a d.c. voltage, wherein there generally occurs a voltage drop in the bump electrodes at the central part of the semiconductor device 15. Thereby, the growth rate of the bump electrode becomes lower in the central part of the semiconductor device 15 than in the peripheral part and the bump electrodes at the peripheral part generally have a height larger than the height of the bump electrodes at the central part of the semiconductor device 15.

When a press-molding process is conducted to such a semiconductor device, in which the height of the bump electrode is changed between the central part and the peripheral part, by using a press plate having an exactly flat surface, the bump electrodes at the central part of the semiconductor device may be buried in the resin film because of the insufficient height of these bump electrodes. Only the bump electrodes at the peripheral part of the semiconductor device are exposed. In such a case, it is not possible to mount the semiconductor device on a substrate such as a printed circuit board.

By using the spacer 30 between the heat plate 22 and the press plate 23, the central part of the press plate 23 is gently projected or bulged in conformity with the variation of height of the bump electrodes, and the bump electrodes are positively exposed from the resin film that covers the surface of the semiconductor device after the press-molding process, irrespective of whether the bump electrodes are located at the central part of the semiconductor chip or at the peripheral part.

As explained before, the second L-shaped catch arm 28 is provided on the top part of the heat plate 22 for engagement with the bottom stepped rim 21b of the balancer 21. In this state, the spherical bearing projection 24 of the heat plate 22 is engaged with the corresponding spherical bearing depression 26 of the balancer 21. By forming the spherical bearing projection 24 and the spherical bearing depression 26 to have the same curvature R, the heat plate 22 is movable or tiltable with respect to the balancer 21 about a hypothetical point A on the bottom surface of the press plate 23, while maintaining a continuous and intimate engagement between the spherical bearing projection 24 and the spherical bearing depression 26. Further, the heat plate 22, and hence the press plate 23 thereon, is rotatable with respect to the balancer 21 in the plane of the press plate 23 about the foregoing point A.

As will be described later in detail, the foregoing tiltable and rotatable construction, or so-called floating structure, of the press plate 23 with respect to the balancer 21 is effective for minimizing the displacement of the press plate 23 with respect to the lower mold 12 at the time of aligning the press plate 23 and the lower mold 12 in accurately parallel relationship.

As described above, the upper mold of the present embodiment has a floating structure for the press plate 23 with respect to the upper fix plate 20, by supporting the balancer 21 with respect to the upper fix plate 20 fixed upon the upper platen 13 by the first catch arm 27 in the movable manner in the horizontal direction and by supporting the heat plate and the press plate 23 with respect to the balancer 21 by the second catch arm 28 in a rotatable or tiltable manner.

Figure 10:
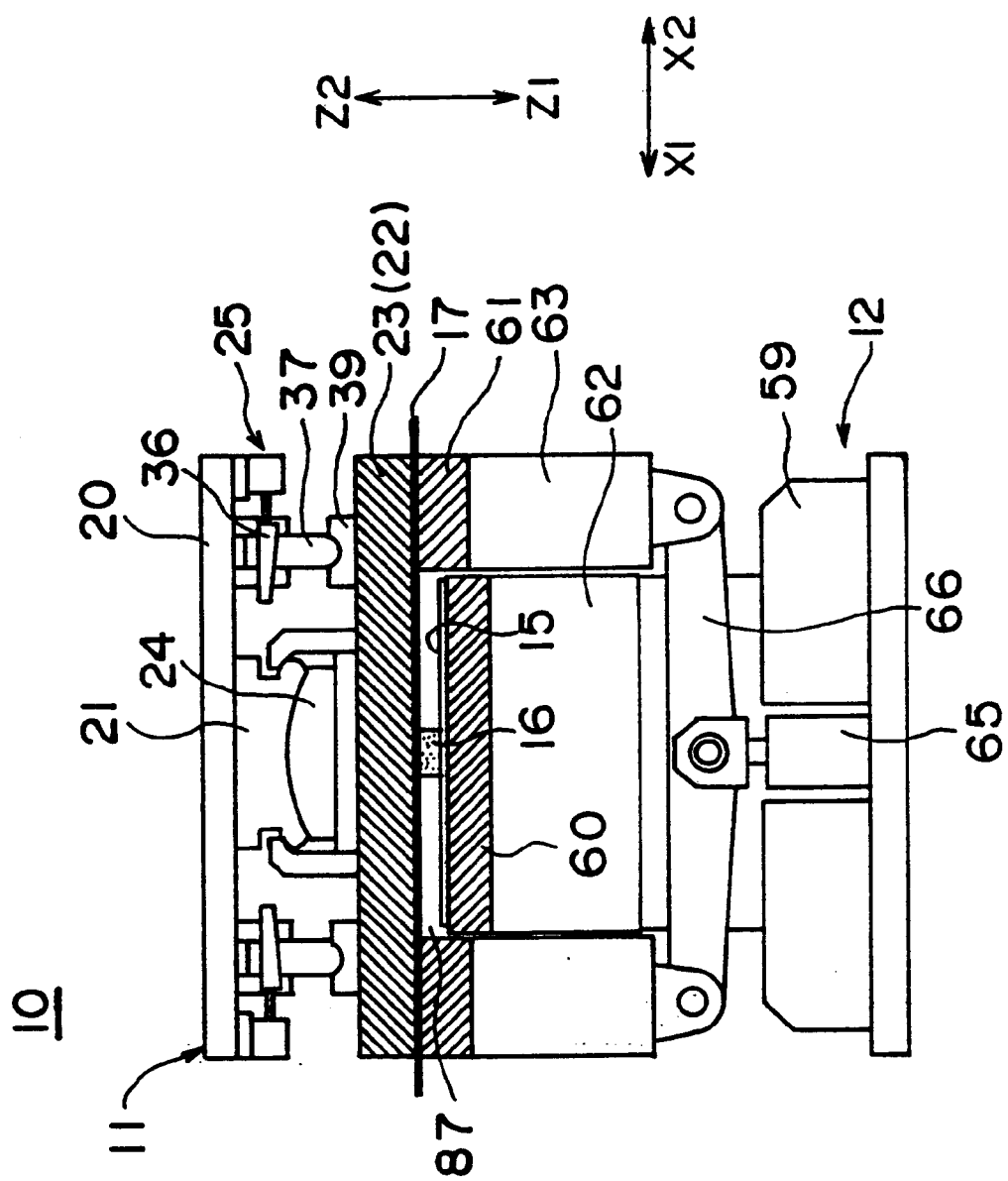

By constructing the press plate 23 to have the floating structure with respect to the upper plate 20, such that the press plate is held tiltable and movable in the horizontal direction, it becomes possible to align the upper mold 11 and the lower mold 12 in the accurately parallel relationship in the state that the upper and lower molds 11 and 12 are mounted on the press (see FIG. 10). The reason of this will be explained hereinafter.

As is well known, the upper mold 11 and the lower mold 12 of the mold 10 are manufactured with a high precision as a result of recent development of the technology of making molds. Thus, the upper mold 11 and the lower mold 12 are in an accurately parallel relationship when the upper mold 11 and the lower mold 12 are joined each other in the state that the upper mold 11 and the lower mold 12 are dismounted from the press.

On the other hand, the press head used for activating the mold 10 is generally manufactured with a lower precision, and thus, it is difficult achieve a desired high precision alignment of the upper and lower molds 11 and 12 in the state that the molds 11 and 12 are mounted on the press, even though the upper and the lower molds 11 and 12 themselves are formed with high precision, because of the tilting between he upper platen 13 and the lower platen 14.

Thus, when the upper mold 11 is rigidly fixed upon the upper platen 13 as practiced in the conventional art, the press plate 23 of the upper mold 11 is more or less tilted with respect to the lower mold 12 and the desired formation of thin resin film with uniform film thickness is not achieved.

On the other hand, the mold 10 of the present invention achieves the exact or near-exact parallel alignment between the upper mold 11 and the lower mold 12 by employing the floating structure for the press plate 23 as noted already. More in detail, the upper and lower molds 11 and 12 are aligned in the desired highly parallel relationship by urging the press plate 23 against the lower mold 12 at the time of the press-molding process. Upon urging the press plate 23, the press plate 23 undergoes a displacement with respect to the lower mold 12 and assumes the desired parallel state with respect to the lower mold 12, even when the press plate 23 is not parallel to the lower mold 12 at the initial state of the press-molding operation.

Next, a description will be made on the balance lock mechanism 25. It should be noted that the balance lock mechanism 25 is used to lock the press plate 23 with respect to the upper fix plate 20 in the state that the press plate 23 is in the desired parallel relationship with respect to the lower mold 12.

Referring to FIG. 3, the balance lock mechanism 25 generally includes a drive unit 35, a wedge lock key 36, a plunger 37, a head holder 39 and a return spring 40, wherein the drive unit 35 may be formed of an air cylinder and is fixed upon the upper fix plate 20. The drive unit 35 further includes a drive shaft 42 movable in the $X_1$- and $X_2$-directions, wherein the drive shaft 42 carries, on the tip end thereof, the foregoing wedge lock key 36. The drive unit 35 is connected to an air pressure unit (not illustrated) and drives the drive shaft 42 in the $X_1$-direction when the press plate 23 assumes the foregoing desired parallel state with respect to the lower mold 12.

The wedge lock key 36, in turn, includes an inclined surface 43 on the lower part thereof and is designed to penetrate through a taper hole 44 of the plunger 37 and a penetrating hole 45 provided in the plunger holder 38.

The plunger 37 has a cylindrical form and carries the foregoing tapered hole 44 as noted above. Further, the plunger 37 has a spherical convex surface 46 at the tip end thereof in the $Z_1$-direction as indicated in FIG. 3. Thereby, the plunger 37 is guided by a cylindrical plunger holder 38 provided on the fix plate 20 and is held movably in the $Z_1$- and $Z_2$-directions. Further, the return spring 40 is disposed between the tip end of the plunger 37 in the $Z_2$-direction and the upper fix plate 20, wherein the return spring 40 urges the plunger 37 in the $Z_1$-direction.

It should be noted that the head holder 39 is fixed upon the top part of the heat plate 22 by a fixing member 41 at a part corresponding to the plunger 37, wherein the head holder 39 has a concaved spherical surface 47 corresponding to the convex spherical surface 46 of the plunger 37. More specifically, the spherical surface 46 and the spherical surface 47 have a generally identical diameter of curvature.

Next, an operation of the balance lock mechanism 25 will be described.

FIG. 3 shows the locked state of the balance lock mechanism 25, in which the drive shaft 42 of the drive unit 35 is moved in the $X_1$-direction. In this locked state, the wedge lock key 36 is displaced also in the $X_1$-direction as a result of the urging action by the drive unit 35. Thereby, it should be noted that the inclined surface 43 of the wedge lock key 36 slides over the tapered hole 44 of the plunger 37 as the wedge lock key 36 is moved in the $X_1$-direction. Thus, the plunger 37 itself is urged in the $Z_1$-direction as a result of the urging of the wedge lock key 36 in the $X_1$-direction.

In response to the movement in the $Z_1$-direction of the plunger 37, the spherical tip end surface 46 of the plunger 37 urges the head holder 39 in the $Z_1$-direction. It should be noted that the foregoing balance lock mechanism 25 is provided at plural locations as represented in FIG. 2. Thereby, all the balance lock mechanisms 25 are activated simultaneously, and the plungers 37 of the balance lock mechanisms 25 urges the head holder 39 in the $Z_1$-direction. In response to this, the heat plate 22 (and hence the press plate 23) is locked with respect to the upper fix plate 20.

Thus, by constructing the balance lock mechanism 25 by using the wedge lock key 36 driven the drive unit 35 and the plunger 37 moved by the wedge lock key 36, it becomes possible to lock the press plate 23 with respect to the upper fix plate 20 with a high precision.

FIG. 4, on the other hand, shows the unlocked. state in which the drive shaft 42 of the drive unit 35 is moved in the $X_2$-direction. In this unlocked state, the wedge lock key 36 is moved also in the $X_2$-direction as a result of the action of the drive unit 35.

As a result of the foregoing movement of the wedge lock key 36 in the $X_2$-direction, the narrow end part of the wedge lock key 36 is now in engagement with the tapered hole 44 in the plunger 37 and the through hole 45 of the plunger holder 38, and the plunger 37 is allowed to move freely with respect to the wedge lock key 36.

Thus, the plunger 37 is now in engagement with the head holder 39 only by the exerting force of the return spring 40 and is movable together with the heat plate 22 or press plate 23 when the plate 22 or 23 is rotated as explained before. In this state, the plate 22 or 23 with respect to the upper fix plate 20 by the balance lock mechanism 25 is unlocked.

In this unlocked state, it should be noted that the plunger 37 is urged against the head holder 39 by the exerting force of the return spring 37 as noted previously. Thus, the movement of the plate 22 or 23 does not cause any creaking sound even when the plate 22 or 23 is displaced. As the convex spherical surface 46 of the plunger 37 has a radius of curvature identical with the radius of curvature of the concaved spherical surface 47 of the head holder 39, a smooth slide movement is achieved between the spherical surface 47 with respect to the spherical surface 46.

Figure 5:
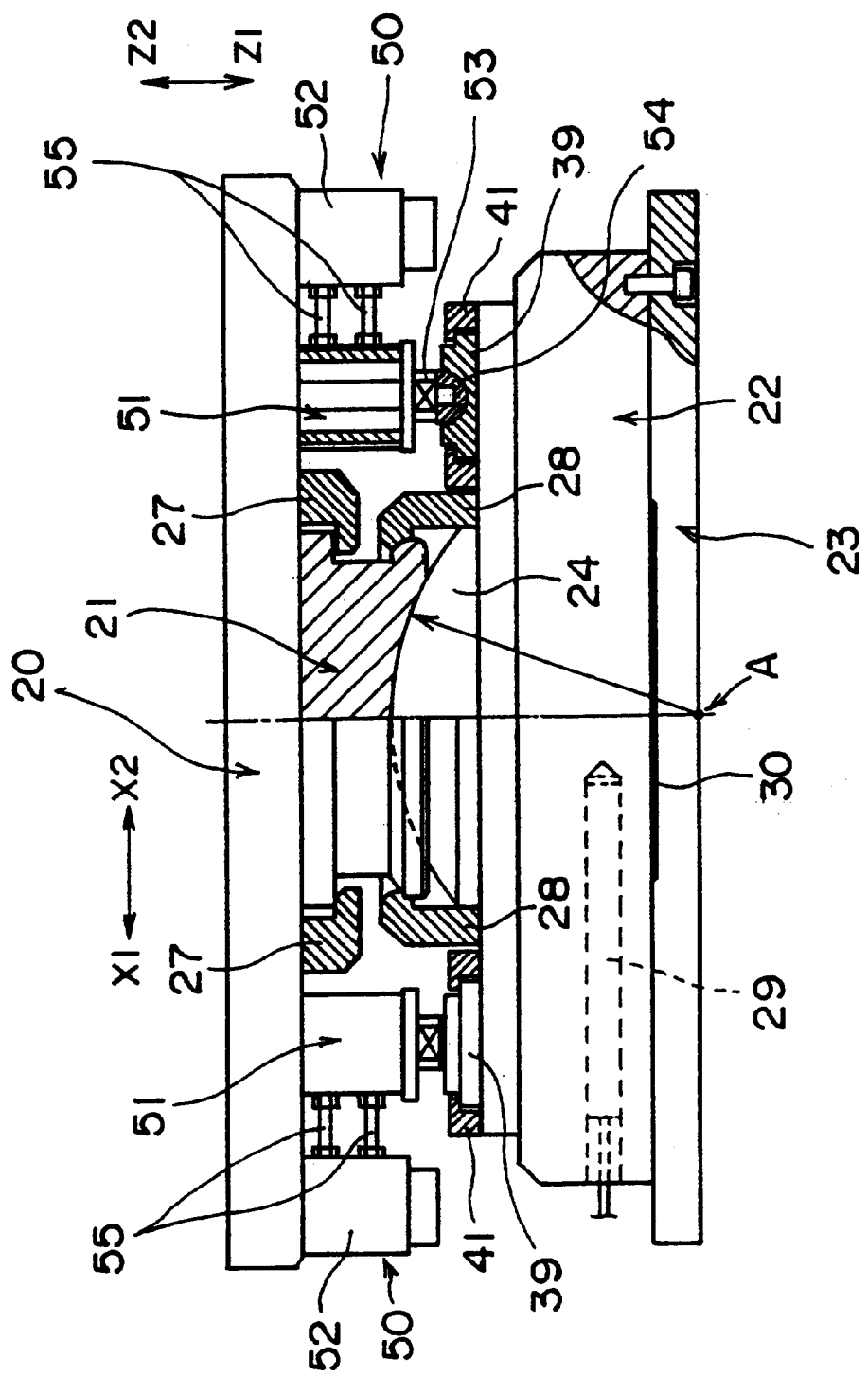
FIG. 5 is a diagram showing a modification of the mold of FIG. 1.

FIG. 5 shows a modification of the upper mold 11, wherein those parts of FIG. 5 corresponding to the parts described previously are designated by the same reference numerals and the description thereof will be omitted.

In the present modification, it should be noted that a balance lock mechanism 50 including a hydraulic cylinder 51, an solenoid valve 52 and a metal pipe 55, is used in place of the balance lock mechanism 25, wherein the hydraulic cylinder 51 and the solenoid valve 52 are mounted on the upper fix plate 20. Further, an oil tank (not illustrated) is connected to the solenoid valve 52 for supplying a hydraulic oil to the hydraulic cylinder 51 via the solenoid valve 52. Further, there is provided a head part 54 on the tip end of the drive shaft of the hydraulic cylinder 51, and a return spring 53 is disposed between the head part 54 and the cylinder 51.

In the balance lock mechanism 50 of the foregoing construction, the solenoid valve 52 closes the hydraulic cylinder 51 and the head part 54 presses the head holder 39. Thereby, the heat plate 22 and the press plate 23 are locked with respect to the upper fix plate 20. In the unlocked state, on the other hand, the solenoid valve 52 opens the hydraulic cylinder 51 such that the hydraulic oil can enter or escape freely from the hydraulic cylinder 51. Thereby, the head part 54 becomes movable and the lock of the heat plate 22 and the press plate 23 with respect to the upper fix plate 20 is canceled.

Thus, according to the balance lock mechanism 50 of the present modification, the press plate 23 is locked and unlocked with respect to the upper fix plate 20 by a simple construction that includes the hydraulic cylinder 51 and the solenoid valve 52. By using the metal pipe 55 for connecting the hydraulic cylinder 51 and the solenoid valve 52, deformation of the pipe by the high pressure of the hydraulic oil is effectively prevented, and the lock of the press plate 23 is achieved with reliability. Similarly, the use of a metal pipe for connecting the oil tank and the press plate 23 also achieves the reliable lock of the press plate 23.

Next, a description will be made on the construction of the lower mold 12 with reference to FIG. 1 and further with reference to FIGS. 6 and 7.

Referring to the drawings, the lower mold 12 generally includes a base block 59, an inner die 60, an outer die 61, a center block 62, a guide ring 63, and a roller 64, wherein the base block 59 is fixed upon the lower platen 14 and includes a hydraulic cylinder 65 at a central part thereof for moving a connection arm 66 in the $Z_1$- and $Z_2$-directions. Above the base block 59, there is provided a center block 62 in correspondence to the central part. of the base block 59, wherein the center block 62 carries thereon the inner die 60.

It should be noted that the center block 62 is fixed on the base block 59 and accommodates therein a heater 72 for heating the inner die 60 at the time of the press-molding process, wherein the heater 72 is used for melting and curing the potting resin.

At the central part of the center block 62, there is provided a central stud 70, wherein the central stud 70 is formed such that a tip end thereof projects from the top surface of the center block 62. Further, the center block 62 includes, at a central part thereof, a cylindrical guide depression 69. Furthermore, the center block 62 carries, on an outer peripheral surface thereof, a plurality of bearing surfaces 75 formed of a hard metal (wear-resistance metal) at predetermined axial locations.

Figure 7:
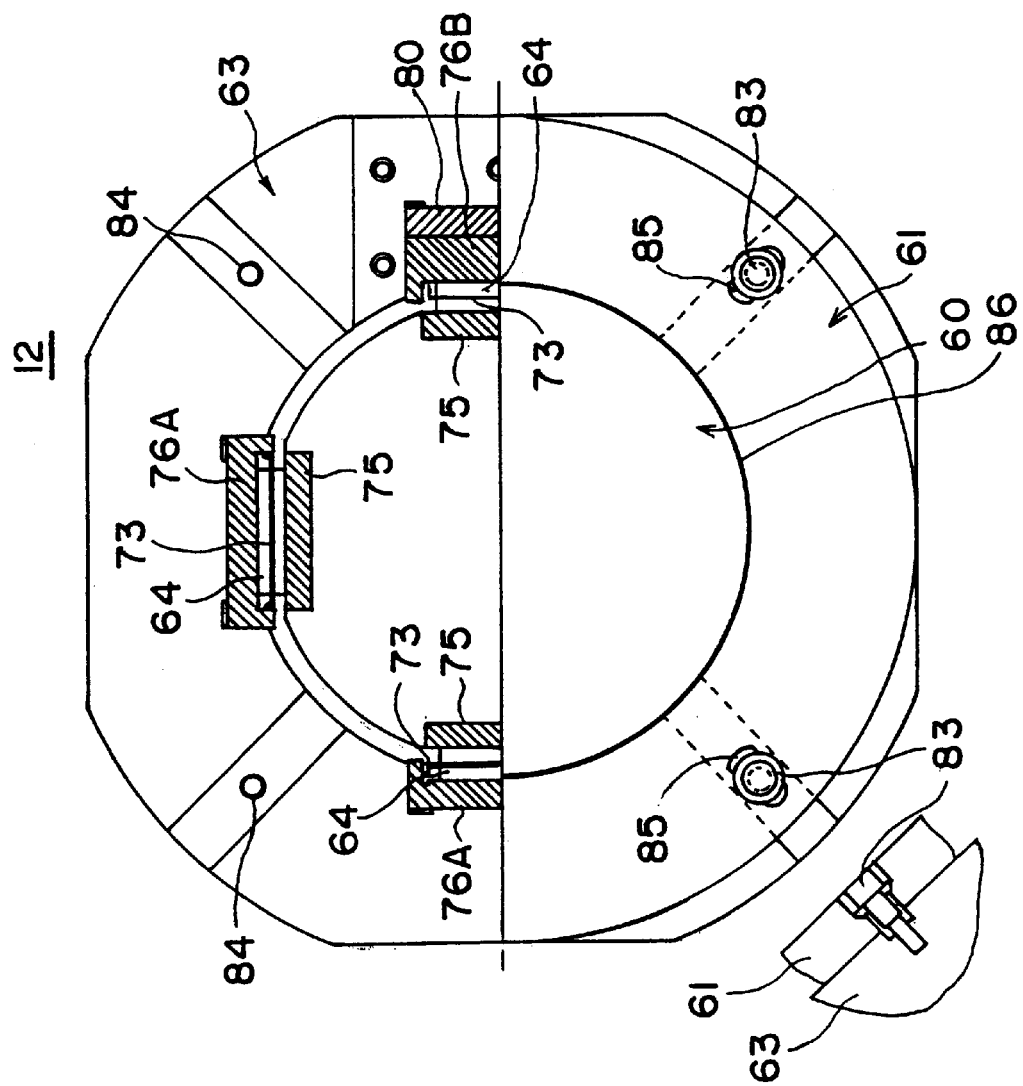
FIG. 7 is another diagram showing the lower mold in an enlarged scale.

It should be noted that the inner die 60 has a generally disk-shaped form as indicated in FIG. 7 and is mounted on the center block 62 described above. It should be noted that the inner die 60 carries thereon the semiconductor device 15 and the potting resin 16 and achieves the press-molding process of the resin 16 in cooperation with the press plate 23 of the upper mold 11. Thus, the inner die 60 has a flat top surface finished with a high precision.

The inner die 60 further includes a screw hole 68 at a central part of the bottom surface, wherein the foregoing screw hole 68 is actually formed at a central part of a cylindrical guide projection 67 formed on the bottom surface of the inner die 60 in correspondence to the central part of the inner die 60. Thereby, the screw hole 68 is threaded with a pitch identical with the pitch of the tread formed on the stud 70. Further, the guide projection 67 is formed to as to fit the foregoing guide depression 69 of the center block 62.

In order to mount the inner die 60 of the foregoing construction on the center block 62, the guide projection 67 of the inner die is inserted into the guide depression 69 of the center block 62. Thereby, a positioning is made for the inner die 60 with respect to the center block 62. Next, the inner die 60 is rotated such that the center stud 70 is screwed into the central screw hole 68. Thereby, it should be noted that the foregoing screwing of the inner die 60 is achieved easily by using a tool engaging a jig hole 74 provided on an outer periphery of the inner die 60.

As noted above, the inner die 60 of the present embodiment is fixed on the center block 62 about a single, central point (stud 70). Thus, the mounting and dismounting of the inner die 60 with respect to the center block 62 is conducted easily by merely rotating the inner die 60. Thus, it is not necessary to replace the entire mold 10 even when the size of the semiconductor device 15 is changed. In such a case, it is sufficient to replace the inner die 60.

When replacing the inner die 60, the outer die 61 to be described later has to be replaced also. Even in such a case, the outer die 61, being mounted on the guide ring 63 by a stud 83, is replaced easily.

It should be noted that the foregoing construction of mounting the inner die 60 on the center block 62 by a single, central support point, is advantageous for minimizing the effect of thermal expansion, which is different between the inner die 60 and the center block 62.

It should be noted that, because of the difference of the material, there inevitably occurs a difference of thermal expansion coefficient between the center block 62 and the inner die 60. Thereby, the thermal expansion should occur radially about the point at which the center block 62 and the inner die 60 are connected. Thus, when the point of connection or point of support is chosen other than the center of the center block 62, there should occur a difference in the thermal expansion within the center block between a peripheral point close to the center of support and a peripheral far from the center of support. Thus, in such a construction, it is difficult to minimize the difference of thermal expansion between the inner die 60 and the center block 62 such that the inner die 60 and the center block 62 expand similarly.

In the present invention, such a problem of difference of thermal expansion is effectively attended to by connecting the center block 62 and the inner die 60 at the central part thereof. By doing so, the thermal expansion occurs radially symmetrically as noted before, and the thermal expansion becomes more or less the same at the periphery of the center block 62 and the inner die 60.

Figure 6:
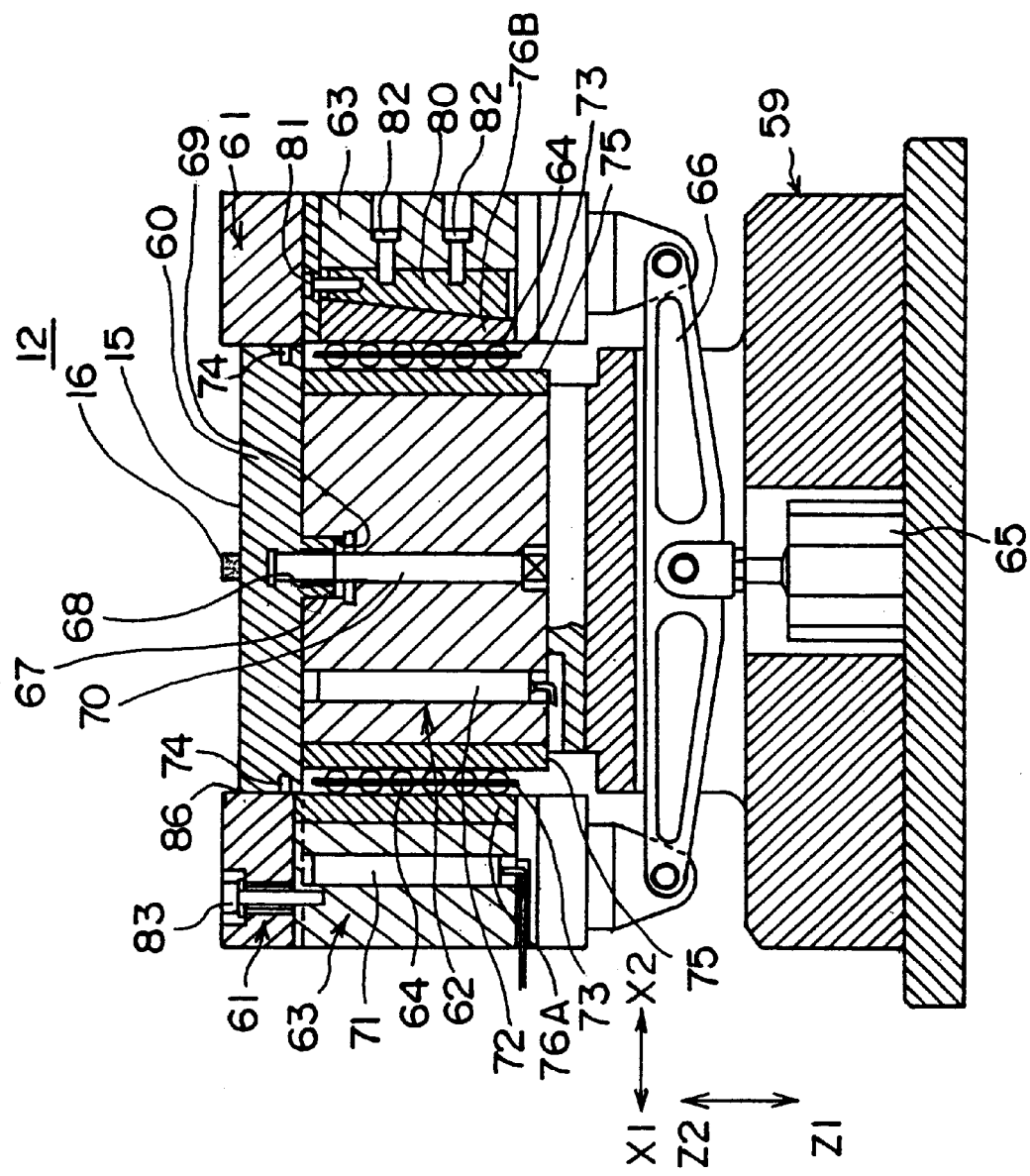
FIG. 6 is a diagram showing a lower mold forming a part of the mold of FIG. 1 in an enlarged scale.

In the construction of FIG. 6, the guide ring 63 is provided on the top part of the connection arm 66 as explained before, wherein it should be noted that the guide ring 63 is provided so as to surround the center block 62. Further, the outer die 61 is connected at the top part of the guide ring 63.

As explained before, the hydraulic cylinder mounted on the base block 59 causes the connection arm 66 to move in the $Z_1$- and $Z_2$-directions. Thereby, the outer die 61 and the guide ring 63 mounted on the connection arm 66 are also moved in the $Z_1$- and $Z_2$-directions by the hydraulic cylinder 65. It should be noted that the inner die 60 and the center block 62 are not moved even when the hydraulic cylinder 65 is activated.

It should be noted that the guide ring 63 includes therein a heater 71, wherein the heater 71 is used to heat the outer die 61 at the time of press-molding process to cause a melting and curing of the potting resin.

In the inner side of the guide ring 63, there are provided a plurality of outer bearing members 76A and a tapered bearing member 76B at respective positions such that an outer bearing member 76A faces one of the plurality of bearing surfaces 75 and that the single tapered bearing member 76B faces also a corresponding bearing surface 75. Each of the outer bearing members 76A and the tapered bearing member 76B are formed of a hard metal (wear-resistance metal).

Thereby, the rollers 64 are disposed between the inner bearing surface 75 and the opposing outer bearing member 75A or the tapered bearing member 76B so as to enable a smooth movement of the guide ring 63 with respect to the center block 62. In the illustrated example, cylindrical bearing rollers are used for the rollers 64, while it is also possible to use ball bearing rollers for the rollers 64. In each of the bearing structures thus formed by the inner bearing surface 75 and the opposing outer bearing member 75A or the tapered bearing member 76B, a plurality of the rollers 64 are provided in parallel relationship such that each of the rollers 64 is held in a freely rotatable state by a roller guide 73 extending horizontally. Thereby, the guide ring 63 is movable smoothly in the $Z_1$- and $Z_2$-directions with respect to the center block 62, and the damage to the thin resin film caused by rattling of the guide ring 63 during such a movement thereof is positively eliminated. Further, the use of such a bearing structure is advantageous for reducing the power needed for the hydraulic cylinder 65. In other words, the use of the bearing structure enables reduction in size of the hydraulic cylinder 65. Thereby, the size of the lower mold 12 is also reduced.

It should be noted that the use of the rollers 64 between the center block 62 and the guide ring 63 itself is not sufficient for guaranteeing the smooth movement of the guide ring 63. In order to guarantee the desired smooth movement of the guide ring 63, it is also necessary to achieve a prescribed degree of parallelism and clearance between the center block 62 and the guide ring 63.

Thus, in order to achieve the prescribed degree of parallelism and clearance between the center block 62 and the guide ring 63, the embodiment of FIG. 6 includes a clearance adjusting mechanism, wherein the clearance adjusting mechanism generally includes the tapered outer bearing member 76B, an adjuster plate 80, an adjuster bolt 81, and a plate fixing screw 82.

It should be noted that the tapered outer bearing member 76B is mounted on the center block 62 in a movable manner in the $X_1$- and $X_2$-directions, wherein the tapered outer bearing member 76B has an inclined or tapered surface at the side away from the surface engaging the rollers 64.

The adjuster plate 80, on the other hand, is a member having a tapered surface corresponding to the tapered surface of the bearing member 76B and is actuated in the $Z_1$- and $Z_2$-directions by screwing or unscrewing the adjuster bolt 81.

Thus, when the adjuster bolt 81 is actuated such that the adjuster plate 80 is moved in the $Z_1$-direction, the tapered outer bearing member 76B is moved in the $X_2$-direction and the clearance between the center block 62 and the guide ring 63 is increased. When the adjuster bolt is actuated in the opposite direction, on the other hand, the tapered outer bearing member 76B is moved in the $X_1$-direction and the clearance between the center block 62 and the guide ring 63 is narrowed.

Thus, by using the foregoing clearance adjusting mechanism, it is possible to adjust the clearance between the center block 62 and the guide ring 63 appropriately after the lower mold 12 is manufactured. Thereby, it is no longer necessary to manufacture the lower mold 12 with high precision. As a result of such an adjustment, the guide ring 63 is moved stably with respect to the center block 62 while maintaining a high precision parallelism between the inner die 60 and the outer die 61. The adjustment of the adjuster bolt 81 is achieved in the state that the outer die 61 is dismounted.

As noted already, the outer die 61 is fixed upon the guide ring 63 by the studs 83. In order to achieve this, the guide ring 63 are formed with screw holes 84 in correspondence to the part where the outer die 61 and the guide ring 63 are connected as indicated in FIG. 7. Further, there are provided elongated holes 85 in the outer die 61, wherein the elongated holes 85 are arranged to extend radially about the center of the inner die 60.

By constructing the elongated holes 85 as noted above, it becomes possible to allow the outer die 61 and the guide ring 63 to cause a mutual displacement in the radial direction for the amount corresponding to the difference of thermal expansion between the outer die 61 and the guide ring 63. Thereby, the accumulation of thermal stress between the outer die 61 and the guide ring 63 is effectively eliminated by absorbing the difference of thermal expansion at the elongated holes 85, and the problem of distortion or warp of the outer die 61 and the guide ring 63 is eliminated. In order to allow the free displacement of the guide ring 63 with respect to the outer die 61, the studs 83 are screwed only lightly in the elongated holes 85. As a result, the desired formation of thin resin film is achieved with reliability.

In the illustrated embodiment, it should be noted that the lower mold 12 includes two heaters, a first heater 72 being provided on the center block 62 and a second heater 71 being provided on the guide ring 63. By using the first and second heaters 71 and 72, it becomes possible to control the temperature of the center block 62 and the guide ring 63 independently.

It should be noted that the heater 72 of the center block 62 is used primarily for heating the inner die 60, while the heater 71 of the guide ring 63 is used to heat the outer die 61. By controlling the heaters 71 and 72 appropriately, the temperatures of the center block 62 and the guide ring 63 are controlled such that a similar amount of thermal expansion occurs in the inner die 60 and in the outer die 61. Thereby, the gap between the inner die 60 and the outer die 61 is controlled and the leakage of the molten resin through such a gap is successfully eliminated.

Next, a description will be made on the press-molding process conducted by using the mold 10 for fabricating a semiconductor device, with reference to FIGS. 8–13. In FIGS. 8–13, only pertinent parts of the mold 10, which was described already in detail with reference to FIGS. 1–7, will be represented for the sake of simplicity.

Figure 8:
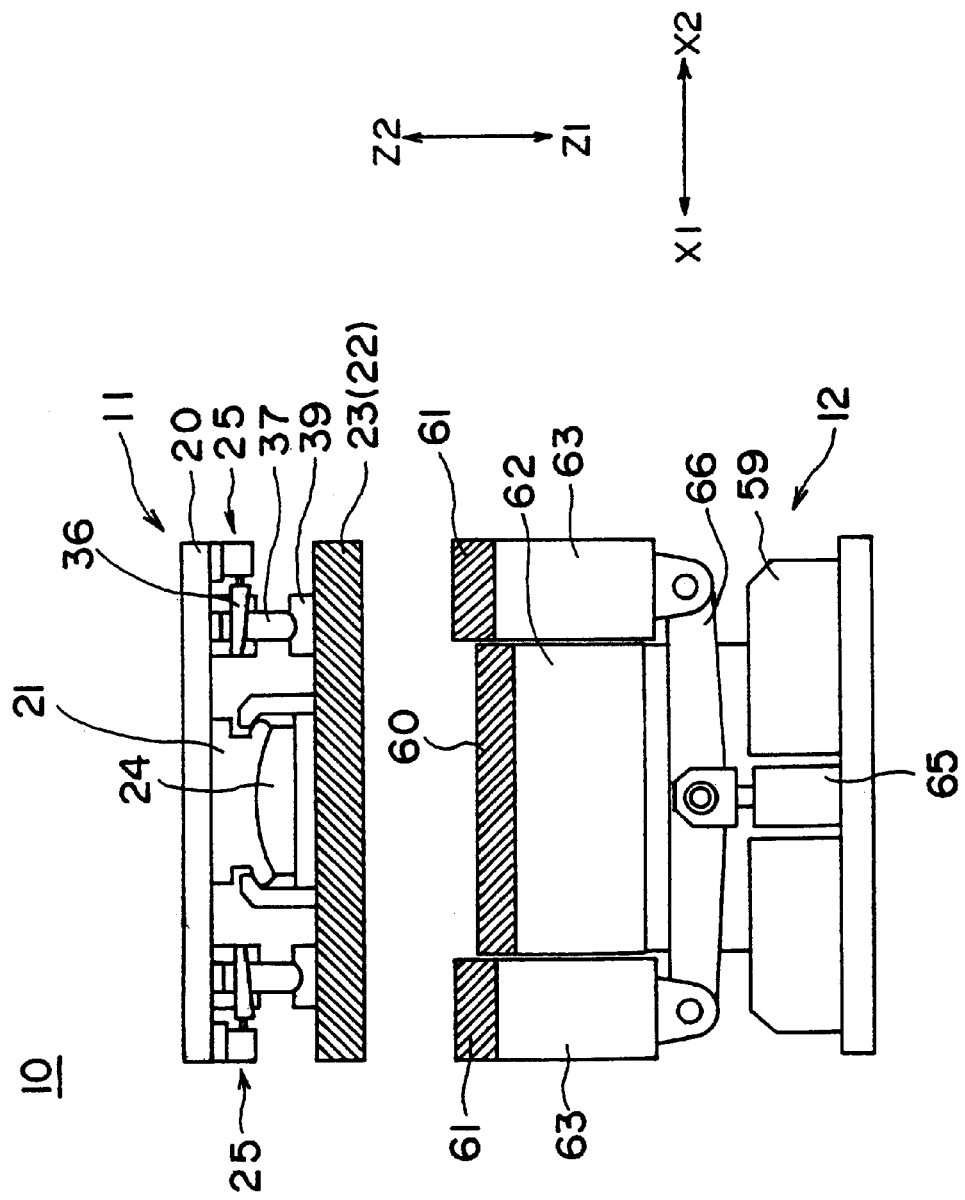
FIGS. 8–13 are diagrams showing a press-molding process conducted by the mold of FIG. 1.

FIG. 8 shows the mold 10 in the state before the starting the press-molding process.

Referring to FIG. 8, the upper mold 11 is moved in the $Z_2$-direction together with the upper platen 13 and the lower mold 12 is moved in the $Z_1$-direction together with the lower platen 14. Thereby, there is formed a large gap between the press plate 23 and the inner die 60. Further, the balance lock mechanism 25 of the upper mold 12 is in the unlocked state, and the press plate 23 is held tiltable with respect to the upper fix plate 20 as a result of the floating structure of the spherical block 24. The press plate 23 is also movable slightly in the $X_1$- and $X_2$ directions.

Figure 9:
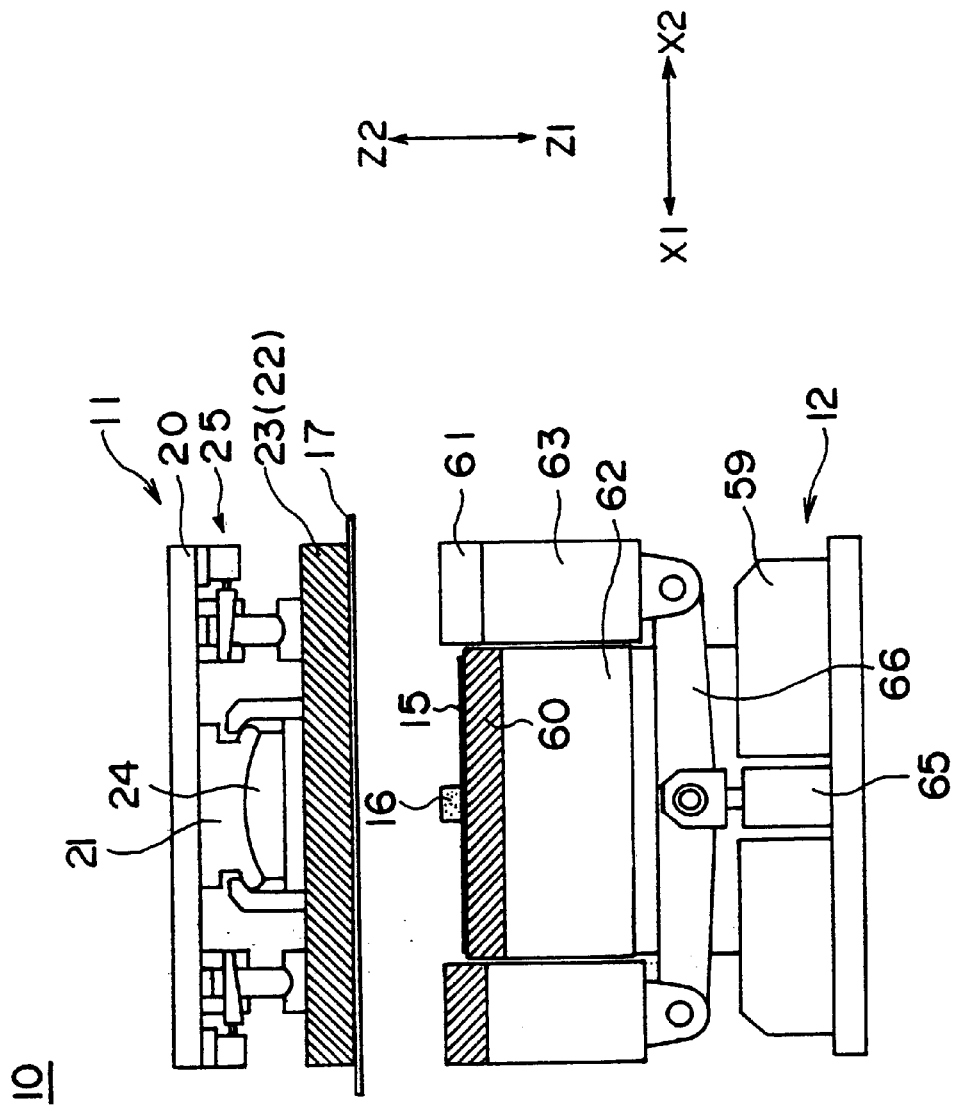

The press-molding process is started with the step of FIG. 9 in which a semiconductor device 15 carrying bump electrodes thereon is placed on the top surface of the inner die 60 such that the side of the semiconductor device 15 carrying the bump electrodes faces in the upward direction. In other words, the semiconductor device 15 is held on the inner die 60 in the state that the bump electrodes face the press plate 23 of the upper mold 11.

After the mounting of the semiconductor device 15 on the lower mold 12 as noted above, a film 17 is placed on the lower surface of the upper mold 11 (lower surface of the press plate 23) uniformly in the state that the film 17 accumulates therein no substantial strain, and a resin tablet 16 is placed on the semiconductor wafer 15. It should be noted that the foregoing film 17 may be formed of any of a polyimide film, a vinyl chloride film, a polycarbonate film, a polyethylene terephthalate film, a biologically decomposable film, a synthetic paper, a metal foil, or a composite of one or more of those, as long as the film 17 does not undergo a deterioration upon heating.

On the other hand, the potting resin forming the resin tablet 16 may be formed of any of polyimide and epoxy (including PPS, PEEK, PES and a heat-resistant thermoplastic resin), and the resin tablet 16 is formed to have a cylindrical shape. The resin tablet 16 is thereby placed generally at the central part of the semiconductor device 15. It should be noted that the resin tablet 16 on the semiconductor device 15 is carefully weighed such that there is no surplus or no shortage of the resin at the time of the press-molding step to be described later.

After the step of FIG. 9, the press is activated and the upper mold 11 is contacted upon the lower mold 12 as indicated in FIG. 10.

During the contacting step of FIG. 10, it should be noted that the press plate 23 undergoes a displacement with respect to the upper fix plate 20 because of the foregoing floating construction, and the upper mold 11 and the lower mold 12 face with each other the highly parallel state even when there is a misalignment between the upper platen 13 and the lower platen 14 of the press.

Upon the alignment of the upper mold 11 and the lower mold 12 in the foregoing parallel state, the balance lock mechanism 25 is switched from the unlocked state to the locked state and the press plate 23 is locked in the parallel state with respect to the lower mold 12 (more specifically the inner die 60 and the outer die 61).

Figure 11:
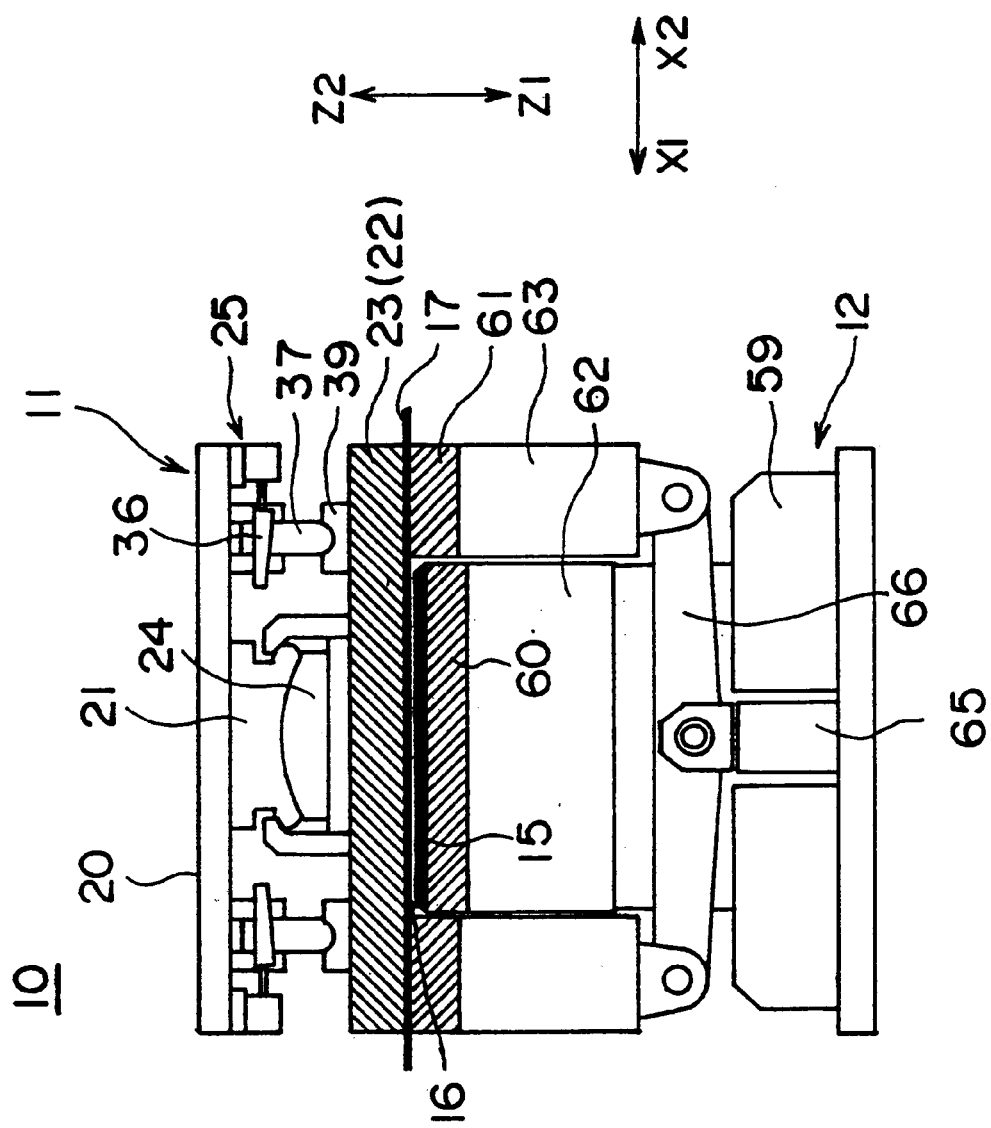

After the foregoing locking of the press plate 23, the heaters 29, 71 and 72 are energized to heat the mold 10 to the temperature causing a melting in the resin tablet 16, and upon confirmation that the resin tablet 16 has been molten, the upper mold 11 is moved toward the lower mold 12 in the step of FIG. 11. During this process, the hydraulic cylinder 65 is activated simultaneously in the $Z_1$ direction together with the outer die 61 and the guide ring 63 thereon, while maintaining a sufficient urging force acting in the $Z_2$-direction against the press plate 23 via the film 17 such that the molten resin does not leak from the contacting surface of the film 17 and the outer die 61.

As a result of the foregoing activation of the press plate 23 in cooperation with the outer die 61, the molten resin 16 is pressed to form a thin resin film covering the surface of the semiconductor device 15. As the press plate 23 and the inner die 60 are in excellent parallel relationship, the thin resin film 16 thus formed has a uniform thickness.

When the upper mold 11, the outer die 61 and the guide ring 63 are lowered at an excessively high speed, the pressure applied to the molten resin 16 becomes excessive and the semiconductor device 15 may be damaged. When the speed of lowering is too small, on the other hand, the throughput of fabrication of the semiconductor device 15 is reduced. Thus, the speed of lowering of the press plate 23 (and also the lowering speed of the outer die 61 and the guide ring 63) is set to an optimized speed in which both problems noted above are avoided.

It should be noted that the lowering of the upper mold 11, the outer die 61 and the guide ring 63 is continued until the film 17 is pressed against the bump electrodes of the semiconductor device 15. In other words, the bump electrodes of the semiconductor device 15 are stuck into the film 17 in the state that the upper mold 11 is fully lowered. In this state, the molten resin covers the surface of the semiconductor device 15 continuously and seals the entire bump electrodes thereon.

Figure 12:
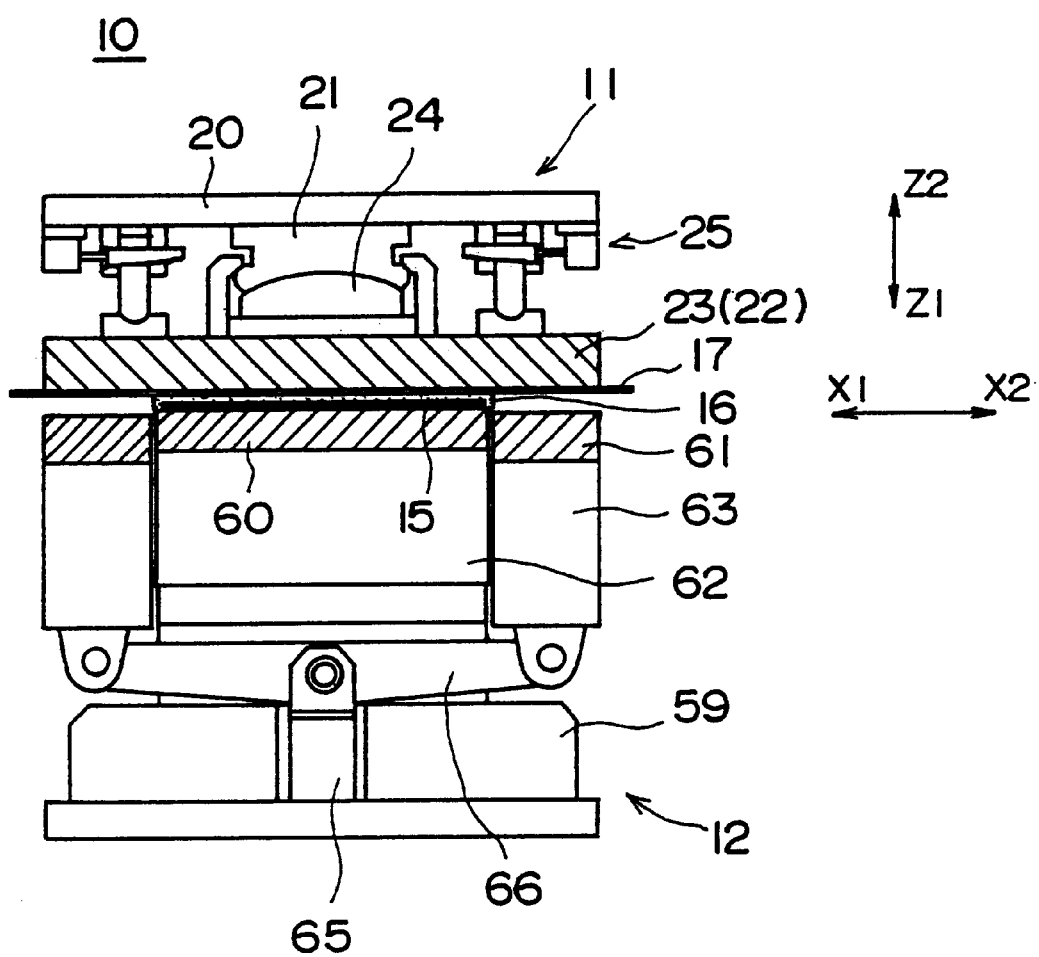

After the foregoing formation of the potting film of the resin 16, the upper mold 11 is separated from the semiconductor device 15 on the lower mold 12 in the step of FIG. 12, wherein the hydraulic cylinder 65 is first activated to cause a lowering of the outer die 61 and the guide ring 63 with respect to the inner die 60 and the center block 62. As a result of this process, the outer die 61 is separated from the film 17. On the other hand, in the state of FIG. 12, the semiconductor device 15 and the resin film 16 are still held between the inner die 60 and the press plate 23.

Figure 13:
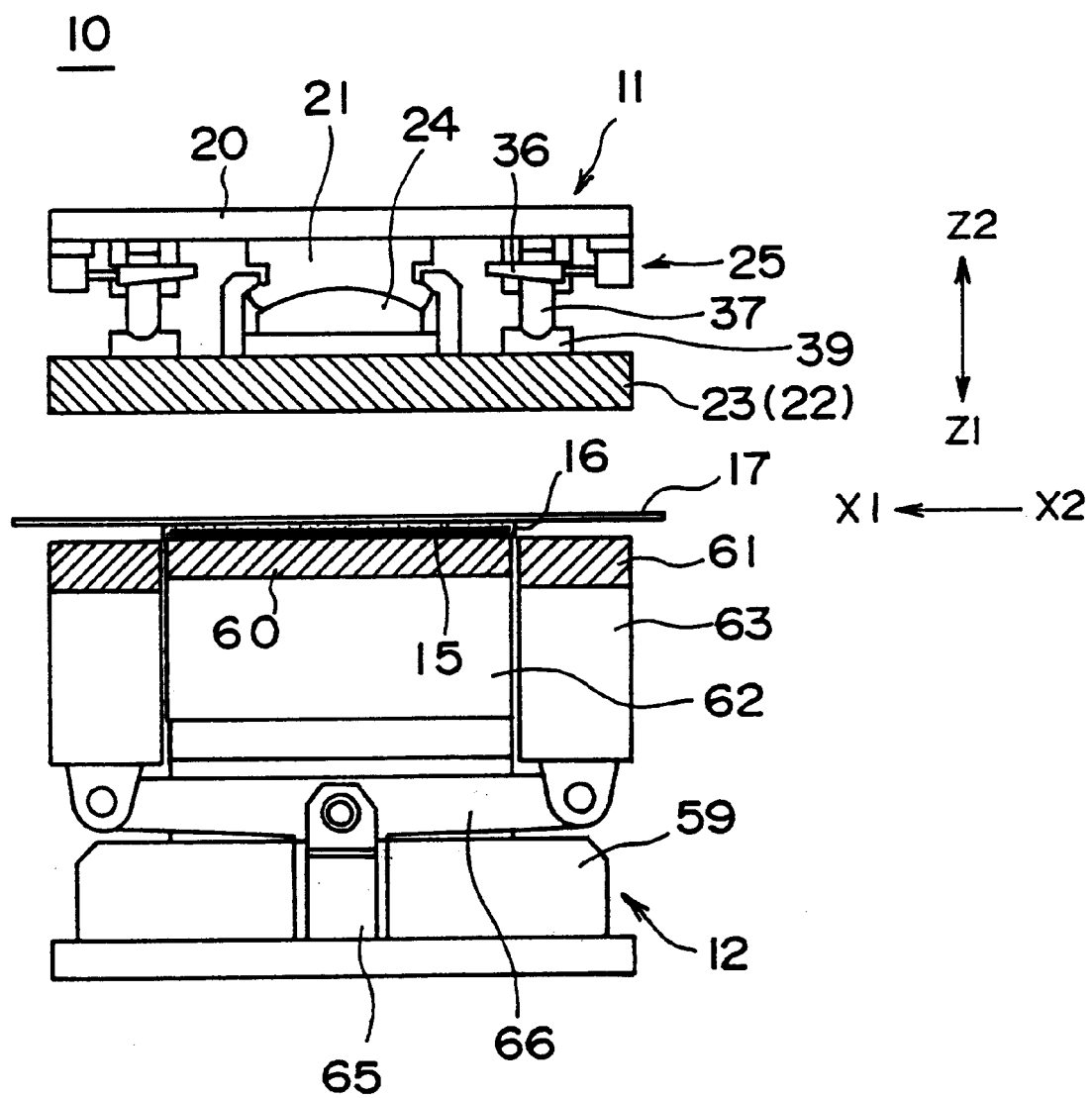

Thus, in the step of FIG. 13, the upper mold 11 is moved in the upward direction ($Z_2$-direction) with respect to the lower mold 12. Thereby, the press plate 23 is separated from the film 17 and it becomes possible to take out the semiconductor device 15 now carrying thereon the potting resin film 16 thereon from the mold 10. After this, the balance lock mechanism 25 is switched to the unlocked state and the hydraulic cylinder 65 is activated such that the outer die 61 and the guide ring 63 are moved in the upward direction with respect to the inner die 60 and the center block 62.

Further, the present invention is by no means limited to the embodiments described heretofore, but various variations and modifications may be made without departing from the scope of the invention.

The present application is based on Japanese priority application No.10-72879 filed on Mar. 20, 1998, the entire contents of which are hereby incorporated by reference.

What is claimed is:

1. A mold for use for fabricating a semiconductor device, comprising:
an upper mold; and
a lower mold disposed so as to face said upper mold, said lower mold supporting a semiconductor substrate thereon, said semiconductor substrate including semiconductor devices having bump electrodes,
said upper mold comprising:
  a press plate pressing a resin tablet disposed on said semiconductor substrate to form a resin layer covering said semiconductor substrate with a thickness of 100 $\mu$m or less;
  a fixing mechanism provided on a press head, said fixing mechanism carrying said press plate movably such that said press plate is tiltable with respect to a nominal plane perpendicular to a direction connecting said upper mold and said lower mold,
  said fixing mechanism including a spherical bearing surface, and
  a lock mechanism of said press plate, said lock mechanism locking said press plate with respect to said fixing mechanism in a locked state and unlocking said press plate with respect to said fixing mechanism in an unlocked state.

2. A mold as claimed in claim 1, wherein said fixing mechanism further carries said press plate movably along said spherical bearing surface.

3. A mold as claimed in claim 1, wherein said press plate is tiltable about a hypothetical central point, said hypothetical central point being located at a center of a principal surface of said press plate.

4. A mold as claimed in claim 1, wherein said lock mechanism includes:
a key member provided on said fixing mechanism in a movable manner between a first position and a second position, said key member being moved between said first position and said second position by an actuator; and a plunger engaging said key member, said plunger urging said press plate when said key member is in said first position corresponding to said locked state, said plunger being disengaged from said press plate in said second position corresponding to said unlocked state.

5. A mold as claimed in claim 1, wherein said lock mechanism includes a hydraulic cylinder provided on said fixing mechanism and a solenoid valve, said hydraulic cylinder taking a first position corresponding to said locked state and a second position corresponding to said unlocked state, said hydraulic cylinder urging said press plate in said first position.

6. A mold as claimed in claim 5, wherein said hydraulic cylinder and said solenoid valve are connected by a metal pipe.

7. A mold as claimed in claim 1, wherein said upper mold further includes a heat plate heating said press plate and one or more spacers disposed between said press plate and said heat plate.

8. A mold as claimed in claim 7, wherein said press plate is mounted detachably on said heat plate.

9. A mold for use for fabricating a semiconductor device, comprising:
an upper mold; and
a lower mold disposed so as to face said upper mold,
said lower mold comprising:
  a base block adapted to be mounted on a press head;
  a center block provided on said base block;
  an inner die provided on said center block so as to face said upper mold, said inner die supporting thereon a semiconductor substrate including therein a semiconductor device having a bump electrode;
  a guide ring provided so as to surround said center block laterally, said guide ring being movable relatively to said center block in a direction of a force exerted by said upper mold when conducting a press-molding process;
  an outer die provided on said guide ring so as to face said upper mold; and
  a rolling body disposed in a gap between an outer periphery of said center block and an inner periphery of said guide ring,
said upper mold having a bearing mechanism, said bearing mechanism including a spherical bearing surface, said upper mold pressing a resin tablet disposed on said semiconductor substrate to form a resin layer covering a surface of said semiconductor substrate with a thickness of 100 µm or less.

10. A mold as claimed in claim 9, wherein said lower mold further includes a clearance adjusting mechanism adjusting a clearance between said center block and said guide ring.

11. A mold as claimed in claim 9, wherein said inner die is mounted on said center block by connecting a central part of said inner die to a central part of said center block.

12. A mold as claimed in claim 11, wherein said inner die includes a guide projection on a central part of a bottom surface thereof, and wherein said center block includes a guide depression corresponding in shape with said guide projection, on a central part of a top surface of said center block.

13. A mold as claimed in claim 9, wherein said outer die and said guide ring are connected so as to allow a relative displacement of said outer die and said guide ring in a radial direction of said guide ring and said outer die.

14. A mold as claimed in claim 9, wherein said inner die and said outer die include respective temperature regulations.

* * * * *